(12) United States Patent
Wu et al.

(10) Patent No.: US 9,519,231 B2
(45) Date of Patent: Dec. 13, 2016

(54) METHOD FOR MEASURING AND CALIBRATING CENTROID OF COARSE STAGE OF PHOTOLITHOGRAPHY TOOL

(75) Inventors: Liwei Wu, Shanghai (CN); Junqing Dong, Shanghai (CN)

(73) Assignee: SHANGHAI MICRO ELECTRONICS EQUIPMENT CO., LTD., Shanghai (CN)

( * ) Notice: Subject to any disclaimer, the term of this patent is extended or adjusted under 35 U.S.C. 154(b) by 496 days.

(21) Appl. No.: 14/115,284

(22) PCT Filed: Apr. 28, 2012

(86) PCT No.: PCT/CN2012/074910
§ 371 (c)(1),
(2), (4) Date: Nov. 21, 2013

(87) PCT Pub. No.: WO2012/149887
PCT Pub. Date: Nov. 8, 2012

(65) Prior Publication Data
US 2014/0074428 A1   Mar. 13, 2014

(30) Foreign Application Priority Data

May 3, 2011 (CN) .......................... 2011 1 0113563

(51) Int. Cl.
*G03F 7/20* (2006.01)
(52) U.S. Cl.
CPC ................... *G03F 7/70725* (2013.01)
(58) Field of Classification Search
CPC .. G03F 7/70725; G03F 7/70358; G03F 7/709;
G03F 7/70758; G03F 17/00; G03F 7/00;
G03F 19/00; H01L 21/02
See application file for complete search history.

(56) References Cited

U.S. PATENT DOCUMENTS 5,910,843 A * 6/1999 Oishi .................. G03F 9/70
250/491.1
6,260,282 B1 7/2001 Yuan et al.
(Continued)

FOREIGN PATENT DOCUMENTS

| CN | 1336539 A | 2/2002 |
|---|---|---|
| CN | 1973250 A | 5/2007 |

(Continued)

*Primary Examiner* — Manuel L Barbee
(74) *Attorney, Agent, or Firm* — Muncy, Geissler, Olds & Lowe, P.C.

(57) ABSTRACT

A method for measuring and calibrating a centroid of a coarse stage of a photolithography tool by means of measuring an offset of the centroid relative to a midpoint of the coarse stage is disclosed. The method includes: individually performing closed-loop controls on parameters of the three degrees of freedom X, Y, and Rz of the coarse stage and converting the parameters into coordinates in a coordinate system of the coarse stage (601); for each of the X and Y directions, estimating a range for the centroid (604), equally dividing the range into N parts (605), and designating each dividing point as an eccentricity (605); obtaining N Rz direction positional deviations by conducting a compensation calibration and a calibration calculation based on each corresponding eccentricity (606-611); comparing a minimum of the N positional deviations with a preset Rz-direction positional deviation threshold (613), completing the measurement if the latter is greater (614), and otherwise designating a range between the eccentricities adjacently in front of and behind the eccentricity corresponding to the minimum positional deviation as a new range for the centroid (616-617) and repeating the measurement until the minimum is smaller than the preset threshold.

21 Claims, 5 Drawing Sheets

(56) References Cited

U.S. PATENT DOCUMENTS

2008/0275661 A1* 11/2008 Yang .................. G03F 7/70725
                                                                                             702/105
2009/0154311 A1* 6/2009 Wiener ............... G03F 7/70725
                                                                                            369/44.32

FOREIGN PATENT DOCUMENTS

| CN | 101114133 A | 1/2008 |
| CN | 101271282 A | 9/2008 |
| CN | 101561635 A | 10/2009 |
| EP | 1 128 216 A2 | 8/2001 |
| JP | 2009-118690 A | 5/2009 |

* cited by examiner

METHOD FOR MEASURING AND CALIBRATING CENTROID OF COARSE STAGE OF PHOTOLITHOGRAPHY TOOL

TECHNICAL FIELD

The present invention relates, in general, to the technical field of the fabrication of equipment for manufacturing integrated circuits, and in particular, to a method for measuring and calibrating a centroid of a coarse stage of a wafer stage of a photolithography tool.

BACKGROUND

Photolithography tools are used to expose an image of a pattern formed on a mask onto a silicon substrate. Currently known photolithography tools include step-and-repeat type ones and step-and-scan type ones. A crucial factor for evaluating the performance of a photolithography tool is accuracy, namely the accuracy of the movement of relative components of the photolithography tool during an exposure process. The relative components that need to be moved include a reticle stage for holding the reticle and a wafer stage for supporting the silicon wafer. In a general case, a standard proportional-integral-derivative (PIM-based control system is employed to control the motion of the components based on positional feedbacks. Moreover, in order to achieve nano-level positioning accuracy and rapid response, the components of the photolithography tool is required to have a high acceleration and deliver a small shock to a measurement reference frame. As the two requirements conflict with each other, many photolithography tools adopt a structure consisting of the wafer stage and a balancing mass, wherein a motor coupled to the wafer stage generates a high acceleration to Meet the requirement for rapid response and the balancing mass absorbs, upon receipt of a reaction force from the motor, the shock from the wafer stage by moving backward to meet the requirement for a small shock to the measurement reference frame. The above wafer stage-balancing mass structure follows the law of conservation of motion of centroid during its movement. In practical applications, the motor drives the wafer stage by applying force on the centroid, i.e. center of mass, of the wafer stage while the position of the wafer stage is measured with respect to a midpoint, i.e. center of form, of the wafer stage. Therefore, it is needed in the position control to shift the control signal from the midpoint to the centroid. The shift has close relationship with the deviation between the midpoint and the centroid, and if the positions of the midpoint and the centroid are not correctly calibrated and leaving a large deviation therebetween, the control performance will not achieve the desired accuracy. Moreover, the large deviation may further cause over-exertion of the motor and excessive heat and high power consumption. Therefore, accurate calibration of the centroid of the wafer stage is required for achieving a good performance of the photolithography tool.

SUMMARY OF THE INVENTION

To overcome the defects exist in the prior art, the present invention provides a method for measuring and calibrating a centroid of a coarse stage, which is capable of optimizing the control of a wafer stage by an algorithm for compensating and controlling a centroid of the wafer stage.

To achieve the above objectives, the present invention discloses a method for measuring and calibrating a centroid of a coarse stage of a photolithography tool by means of measuring an offset of the centroid relative to a midpoint of the coarse stage. The method includes: step 1, individually performing closed-loop controls on parameters of three horizontal degrees of freedom (X, Y, Rz) of the coarse stage and converting the parameters into coordinates in a coordinate system of the coarse stage; step 2, estimating an initial X-direction range and an initial Y-direction range for the centroid and equally dividing each of the initial X-direction range and the initial Y-direction range into N parts, designating the dividing points as eccentricities; step 3, obtaining N Rz-direction positional deviations by conducting a calibration calculation with the controller based on the eccentricities; step 4, comparing a minimum Rz-direction positional deviation derived from the N Rz-direction positional deviations with a preset Rz-direction positional deviation threshold, if the minimum is smaller than the preset Rz-direction positional deviation threshold, finishing the measurement, and otherwise designating an updated centroid range whose limits are selected as eccentricities adjacently in front of and behind the eccentric corresponding to the minimum Rz-direction positional deviation, respectively, and repeating step 3; and step 5, deriving the actual offset of the centroid, Further, conducting a compensation calculation, based on the actual X-direction and Y-direction eccentricities and a midpoint coordinate of the coarse stage fed back in real time to the controller, to adjust the parameters of three horizontal degrees of freedom (X, Y, Rz) of the coarse stage.

Further, the closed-loop control in the X direction may be performed by using an X-direction grating and the closed-loop controls in the Y and Rz directions may be performed by using two Y-direction gratings after a coordinate system conversion process. The coordinate system of the coarse stage is centered at a common zero position of the X-direction and Y-direction gratings and also at the midpoint of the coarse stage. The initial X-direction and Y-direction ranges for the centroid in the coordinate system of the coarse stage are estimated according to a mass and a design centroid of the coarse stage.

Further, the compensation calculation may include: collecting readings of the respective gratings and obtaining midpoint coordinates of the coarse stage with respect to X, Y and Rz axes, respectively; receiving desired control forces from the controller for X, Y and Rz logic axes; and allocating output forces to physical axes of the respective actuators according to a compensation algorithm.

The compensation algorithm may include the following equation:

$$\begin{cases} f_x = F_x^* \\ f_{y1} = -\dfrac{\Delta y}{L_y} F_x^* + \dfrac{L_{y2}(x)}{L_y} F_y^* - \dfrac{J_{z0}}{L_y \cdot J_z(x)} T_z^* \\ f_{y2} = \dfrac{\Delta y}{L_y} F_x^* + \dfrac{L_{y1}(x)}{L_y} F_y^* + \dfrac{J_{z0}}{L_y \cdot J_z(x)} T_z^* \end{cases}$$

where, $\Delta x$ represents an X-direction eccentricity of the coarse stage, $\Delta y$ represents a Y-direction eccentricity of the coarse stage, $L_y$ represents an X-direction distance between a Y-direction actuator and an origin of the coordinate system of the coarse stage, $J_{z0}$ represents a rotational inertia of the coarse stage about the vertical axis of the centroid, x represents the reading of the X-direction grating, $F_x^*$, $F_y^*$ and $T_z^*$ respectively represent the desired control forces for the X, Y and Rz logic axes, and $f_x$, $f_{y1}$ and $f_{y2}$ respectively represent desired output forces for the physical axes of the respective actuators.

The equations of the compensation algorithm may further include:

$$\begin{cases} r_1 = 1 \\ r_2 = -\dfrac{\Delta y}{L_y} \\ r_3 = \dfrac{\Delta y}{L_y} \end{cases} \begin{cases} s_1 = 0 \\ s_2 = \dfrac{L_{y2}(x)}{L_y} = \dfrac{L_{y2}}{L_y} - \dfrac{\Delta x}{L_y} - \dfrac{m_x}{m_y \cdot L_y} x = -\alpha_1 \cdot x + \beta_{11} \\ s_3 = \dfrac{L_{y1}(x)}{L_y} = \dfrac{L_{y1}}{L_y} + \dfrac{\Delta x}{L_y} + \dfrac{m_x}{m_y \cdot L_y} x = \alpha_1 \cdot x + \beta_{12} \end{cases}$$

$$\begin{cases} t_1 = 0 \\ t_2 = -\dfrac{J_{z0}}{L_y \cdot J_z(x)} = -\dfrac{J_{z0}}{L_y} \dfrac{1}{J_{z0} + \dfrac{m_x}{m_y}(m_y - m_x) \cdot x^2 + m_y \cdot \Delta x^2} = \dfrac{1}{\alpha_2 \cdot x^2 + \beta_2} \\ t_3 = \dfrac{J_{z0}}{L_y \cdot J_z(x)} = \dfrac{J_{z0}}{L_y} \dfrac{1}{J_{z0} + \dfrac{m_x}{m_y}(m_y - m_x) \cdot x^2 + m_y \cdot \Delta x^2} = \dfrac{1}{\alpha_2 \cdot x^2 + \beta_2} \end{cases}$$

where, $\alpha_1$ represents a rate of change of a distance from a centroid of an X-direction mass $m_x$ to any of the $f_{y1}$ and $f_{y2}$ physical axes caused by a change in an X-direction displacement of a fine stage, $\beta_{11}$ represents an allocation ratio of thrust command when the X-direction mass $m_x$ is at a zero position and a moment at a centroid of a Y-direction mass $m_y$ is balanced in a direction of the $f_{y1}$ physical axis, $\alpha_2$ represents a rate of change of an inertia moment about a $T_z^*$ axis at the centroid of the Y-direction mass $m_y$ caused by the change in the X-direction displacement of the fine stage, $\beta_{12}$ represents an allocation ratio of thrust command when the X-direction mass $m_x$ is at the zero position and a moment at the centroid of the Y-direction mass $m_y$ is balanced in a direction of the $f_{y2}$ physical axis, $\beta_2$ represents a constant scaling factor of the inertia moment about the $T_z^*$ axis at the centroid of the Y-direction mass $m_y$ caused by the change in the X-direction displacement of the fine stage, $r_1$, $r_2$, $r_3$ respectively represent factors of transformation from physical axes $f_x$, $f_{y1}$, $f_{y2}$ to logic axis $F_x^*$, $s_1$, $s_2$, $s_3$ respectively represent factors of transformation from physical axes $f_x$, $f_{y1}$, $f_{y2}$ to logic axis $F_y^*$, and $t_1$, $t_2$, $t_3$ respectively represent factors of transformation from physical axes to $f_x$, $f_{y1}$, $f_2$ logic axis $T_z^*$.

Further, step 3 may further include: substituting each eccentricity into the centroid measurement and calibration calculation; during the calibration calculation of the X-direction eccentricities, the coarse stage is kept at a zero position in both the X direction and the Rz direction by the closed-loop control, and the Y direction may be provided with a motion trajectory; during the calibration calculation of the Y-direction eccentricities, the coarse stage is kept at a zero position in both the Y direction and the Rz direction by the closed-loop control, and the X direction is provided with a motion trajectory.

The calibration calculation of the X-direction eccentricities may include the steps of:

S101, estimating a range for $\Delta x$ in the coordinate system of the coarse stage and setting a value of $\Delta x$ as a lower limit of the range;

S102, retrieving the coarse stage to a zero position of the X-direction grating and carrying out a closed-loop servo control;

S103, closed-loop controlling the coarse stage to keep at a zero position in the Rz direction, performing a closed-loop control in the Y direction and providing the Y direction with a one-pass forth-and-back trajectory, tracking and recording an Rz-direction positional deviation;

S104; setting a stroke and changing the value of $\Delta x$ by one stroke, providing the Y direction with the same one-pass forth-and-back trajectory as in step S103, and recording a corresponding Rz-direction positional deviation;

S105, successively changing the value of $\Delta x$ by one stroke until the upper limit of the range estimated in S101 is reached; and S106, fitting the Rz-direction positional deviations obtained in the repeated one-pass forth-and-back motions into two parabolas using a method of least squares, and identifying the actual eccentricity as the extremum of either of the parabolas.

The calibration calculation of the Y-direction eccentricities may include the steps of:

S201, estimating a range for $\Delta y$ in the coordinate system of the coarse stage and setting a value of $\Delta y$ as a lower limit of the range;

S202, retrieving the coarse stage to a zero position of the Y-direction gratings and carrying out a closed-loop servo control;

S203, closed-loop controlling the coarse stage to keep at a zero position in the Rz direction, performing a closed-loop control in the X direction and providing the X direction with a one-pass forth-and-back trajectory, tracking and recording an Rz-direction positional deviation;

S204, setting a stroke and changing the value of $\Delta y$ by one stroke, providing the X direction with the same one-pass forth-and-back trajectory as in step S203, and recording a corresponding Rz-direction positional deviation;

S205, successively changing the value of $\Delta y$ by one stroke until the upper limit of the range estimated in S201 is reached; and S206, fitting the Rz-direction positional deviations obtained in the repeated one-pass forth-and-back motions into two parabolas using a method of least squares, and identifying the actual eccentricity as the extremum of either of the parabolas.

Compared with the prior art, the present invention is able to determine an offset of the centroid of the wafer stage relative to a measurement center of physical sensors coupled to the wafer stage based on measurements of the physical sensors. The method is simple and practical without requiring any additional measuring equipment. Moreover, the control performance is improved in a real-time fashion through a compensation calculation based on the measured centroid coordinates fed back to the controller.

BRIEF DESCRIPTION OF THE DRAWINGS

Advantages and principles of the present invention can be further understood by means of reference to the following detailed description and the accompanying drawings, wherein.

DETAILED DESCRIPTION OF THE INVENTION

The invention, in its several specific embodiments, is described below together with figures herein referenced and incorporated by reference in this disclosure.

The present invention provides a centroid measurement and calibration method based on the concept of measuring and calibrating a centroid of a wafer stage in a coordinate system centered at a midpoint of the wafer stage with position sensors coupled to the wafer stage and optimizing the control of the wafer stage by a compensation and control algorithm for the wafer stage centroid.

Specifically, keep the wafer stage, during its motion, at the zero position in the Rz direction by the closed-loop servo control. When the driving force is not applied on the centroid, the output of the Rz-direction servo motor will vary with the change of eccentricities. Stated more specifically, when the force happens to be applied on the centroid, the output of the Rz-direction servo motor will reach a minimum value, and when the point of force application is deviated from the centroid in either of the positive and negative directions, the output of the Rz-direction servo motor will increase. On the basis of this fact, an actual position of the centroid of the wafer stage could be determined by: prescribing a range for the eccentricity, i.e. a positional deviation from the force point to the centroid; interpolating several equally spaced points in the range as decoupling points for the driving; and finding the decoupling point which substantially coincides with the actual centroid when the output of the controller or the positional deviation reaches a minimum. Moreover, each of the prescribed decoupling points is fed back into a controller algorithm to facilitate real-time decoupling control. In this way, when the measurement and calibration of the actual centroid is finished, the parameters of the control algorithm is also optimized, thereby optimizing the control of the wafer stage.

Figure 1:
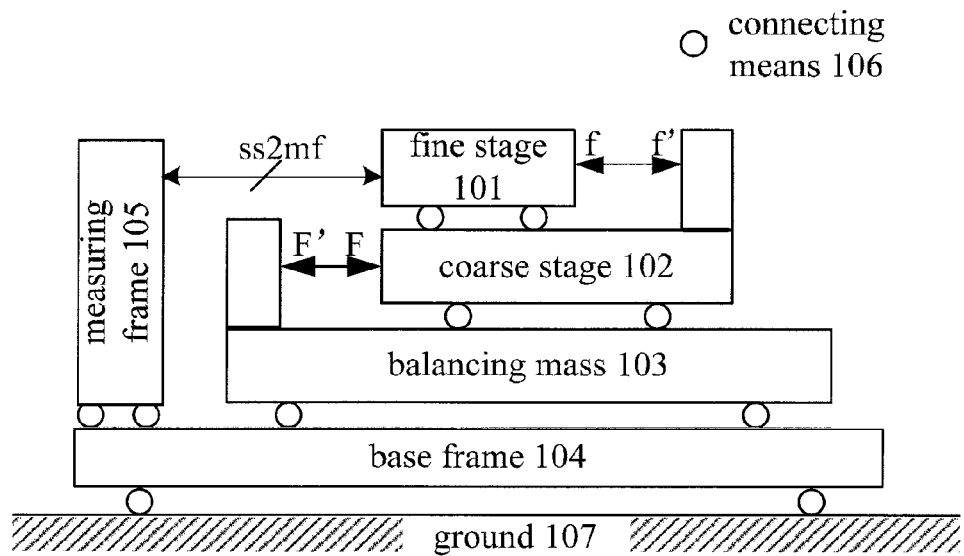
FIG. 1 is a schematic showing a wafer stage used in a photolithography tool.

The centroid measurement and calibration method of the present invention will be further described in detail below by referring to FIG. 1, which is a schematic diagram illustrating a wafer stage of a photolithography tool. As shown in FIG. 1, a substrate to be exposed, such as a silicon wafer, or a glass substrate, is placed on a fine stage 101, the fine stage 101 is disposed on a coarse stage 102. The fine stage 101 and coarse stage 102 are coupled together by a connecting means 106 (each small circle in FIG. 1 represents such a connecting means) such as, for example, an air bearing, a magnetic bearing or any other proper connecting means. The fine stage 101 is capable of moving with six degrees of freedom in space. Additionally, the coarse stage 102 is disposed on a balancing mass 103 and coupled thereto by another connecting means 106, and the balancing mass 103 is disposed on a base frame 104 on which there is further disposed a measuring frame 105. Each of the pair of the balancing mass 103 and the base frame 104 and the pair of the base frame 104 and the measuring frame 105 is coupled together by a connecting means 106, which may be an air bearing, a magnetic bearing or any other proper connecting means. Furthermore, the base frame 104 is placed on the ground 107. The connecting means 106 between the base frame 104 and the ground 107 is not specifically limited in this invention, but the base frame 104 is directly loaded on the ground 107 in most cases.

In the illustrated embodiment, a primary task of the lithography tool is to rapidly and accurately position the substrate held on the fine stage 101 by measuring a relative position of the fine stage 101 with respect to the measuring frame 105, feeding back the relative position, comparing the relative position with a predetermined motion trajectory of the fine stage 101 and thereby deriving a positional deviation. A control signal is then generated by adjusting and amplifying the deviation signal with a feedback controller, and the control signal is delivered to actuators of the fine stage 101 which thereafter drives the fine stage 101 to make a corresponding motion, thereby forming a closed-loop control system.

However, relying only on this closed-loop controlled, large stroke motion of the fine stage 101 generally cannot result in a desired positioning accuracy of the substrate. Therefore, the coarse stage 102 is introduced to achieve the rapid and accurate positioning by combining the fine stage control with the coarse stage control, and a balancing mass 103 is further introduced to reduce, by its backward movement, possible interference of the whole wafer stage system to the external environment. Both of the coarse stage 102 and the balancing mass 103 are also set into a closed-loop control fashion. The coarse stage 102 employs gratings to measure its relative position to the balancing mass 103, and the balancing mass 103 also employs gratings to measure its relative position to the base frame 104.

Figure 2:
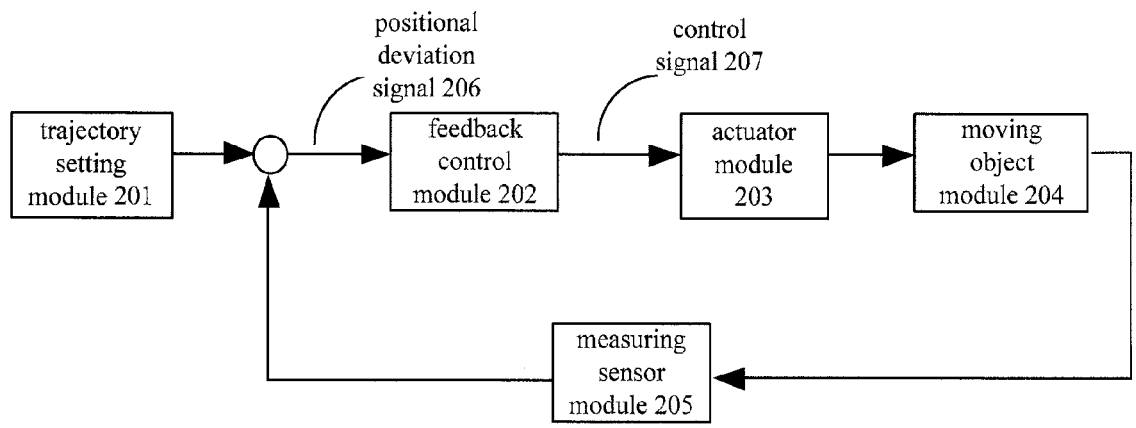
FIG. 2 is a skeleton block diagram depicting a system for performing the closed-loop control.

FIG. 2 is a skeleton block diagram depicting a specific example of the closed-loop control. As shown in FIG. 2, 201 represents a trajectory setting module, 202 represents a feedback control module, 203 represents an actuator module, 204 represents a moving object module, 205 represents a measuring sensor module, 206 represents a positional deviation signal generated after comparing a measured actual position with the preset trajectory, and 207 represents a control signal generated after processing the positional deviation signal 206 with the feedback control module 202.

Figure 3:
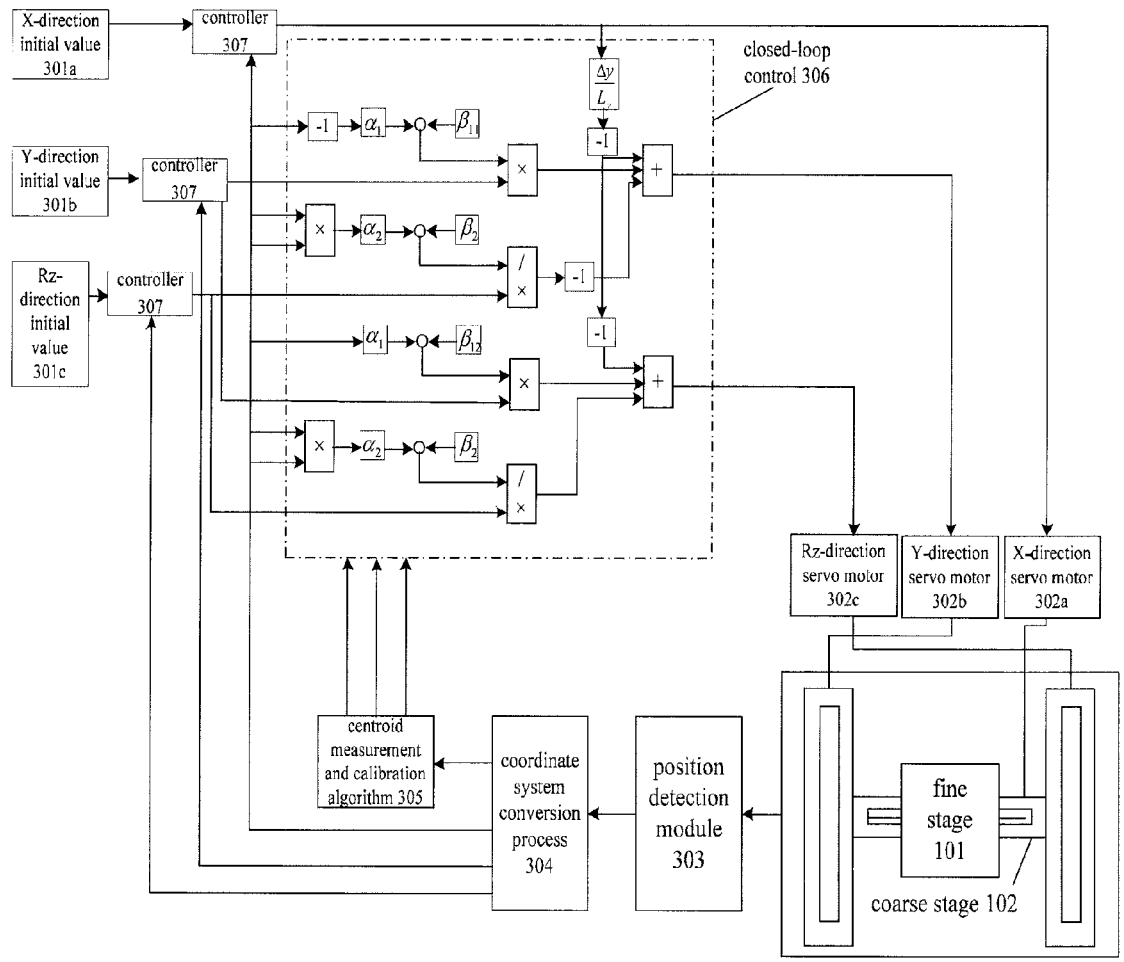
FIG. 3 is a skeleton block diagram depicting a centroid measurement and calibration method in accordance with the present invention.

FIG. 3 is a skeleton block diagram depicting a centroid measurement and calibration process in accordance with the present invention. In FIG. 3, 301a represents an X-direction initial value, 301b represents a Y-direction initial value and 301c represents an Rz-direction initial value of the coarse stage. After the X-direction initial value passed through a controller 307 and then reached an X-direction servo motor 302a, the coarse stage undergoes a corresponding displacement in the X direction, and a closed-loop control 306 is performed on the degree of freedom X. Thereafter, a position detection module 303 measures the X-direction displacement, followed by a coordinate system conversion process 304 which converts the displacement into coordinates of a coordinate system of the coarse stage. The coordinate system of the coarse stage is centered at a common zero position of the X-direction and Y-direction gratings, which is also at the midpoint of the coarse stage, After the coordinate system conversion process 304, a centroid measurement and calibration algorithm 305 is carried out to calculate an X-direction eccentricity, during which, the coarse stage is closed-loop controlled to keep at the zero position of the gratings in the X direction and Rz direction, and a motion trajectory is provided for the Y direction. Similarly, the Y-direction and Rz-direction initial values follow the same process including closed-loop control 306, coordinate system conversion 304 and centroid measurement and calibration algorithm 305 in this order. Moreover, the measured centroid is further fed back to the controller compensation algorithm to improve the control performance in a real time fashion. The compensation algorithm includes: collecting readings of the respective gratings (after coordinate system conversion) and obtaining midpoint coordinates of the coarse stage with respect to X, Y and Rz axes, respectively; receiving desired control forces from the controller for the X, Y and Rz axes; and allocating output forces to the associated physical actuators according to the following equations (5) and (6).

In light of the description above, in order to achieve the rapid and accurate positioning, it is required to accurately measure the relative position of the centroid of the coarse stage with respect to the midpoint thereof.

Centroid control algorithm:

At first, a coordinate system of the coarse stage is established:

The coordinate system is centered at a geometric center of stator of an X-direction motor of the coarse stage and X, Y and Z axes extending parallel to and in the same directions respectively as those of an X-Y-Z Coordinate system of the wafer stage. Moreover, the origin of the coordinate system of the coarse stage is taken as at a common zero position of the X-direction and Y-direction gratings.

Next, the following parameters are defined:

$m_x$ represents an X-direction mass of the coarse stage;

$m_y$ represents a Y-direction mass of the coarse stage;

$\Delta x$ represents an X-direction eccentricity of the coarse stage, which is a distance from the centroid of the coarse stage to the origin of the coordinate system of the coarse stage with respect to the X direction, the distance is signed positive or negative;

$\Delta y$ represents a Y-direction eccentricity of the coarse stage, which is a distance from the centroid of the coarse stage to the origin of the coordinate system of the coarse stage with respect to the Y direction, the distance is signed positive or negative;

$L_{y1}$ represents an X-direction distance from a motor Y1 to the origin of the coordinate system of the coarse stage with respect to the X direction;

$L_{y2}$ represents an X-direction distance from a motor Y2 to the origin of the coordinate system of the coarse stage with respect to the X direction, Wherein the motors Y1 and Y2 are respectively located on the positive half and negative half of the X axis, oriented parallel to the Y direction and provided as a physical actuator for driving the coarse stage to move in the Y direction and the Rz direction, respectively;

$L_{y1}(x)$ represents a distance from a force output point of the motor Y1 to an X-direction centroid of the coarse stage, expressed as $$L_{y1}(x) = L_{y1} + \Delta x + \frac{m_x}{m_y}x;$$

$L_{y2}(x)$ represents a distance from a force output point of the motor Y2 to the X-direction centroid of the coarse stage, expressed as $$L_{y2}(x) = L_{y2} - \Delta x - \frac{m_x}{m_y}x;$$

$L_y$, expressed as $L_y=L_{y1}(x)+L_{y2}(x)$, represents an interval between the two motors Y1, Y2 with respect to the X direction;

$J_{z0}$ represents a rotational inertia of the coarse stage about a Z axis of the centroid; and x represents a reading of the X-direction grating.

If the desired control forces for the X, Y and Rz logic axes are defined as $F_x^*$, $F_y^*$, $T_z^*$, and the actual forces output from the corresponding physical actuators, namely, the forces output from movers of the X-direction motor and the motors Y1 and Y2, are respectively defined as $f_x$, $f_{y1}$, $f_{y2}$, the relationship between the forces can be correlated according to:

$$\begin{bmatrix} f_x \\ f_{y1} \\ f_{y2} \end{bmatrix} = \begin{bmatrix} r_1 & s_1 & t_1 \\ r_2 & s_2 & t_2 \\ r_3 & s_3 & t_3 \end{bmatrix} \times \begin{bmatrix} F_x^* \\ F_y^* \\ T_z^* \end{bmatrix} \quad \text{Equation (1)}$$

Moreover, if forces outputs from the centroid of the coarse stage in the three degrees of freedom are defined as $F_x$, $F_y$, $T_z$, they can be correlated with the actual forces output from the corresponding physical actuators according to:

$$\begin{bmatrix} F_x \\ F_y \\ T_z \end{bmatrix} = \begin{bmatrix} 1 & 0 & 0 \\ 0 & 1 & 1 \\ -\Delta y & -L_{y1}(x) & L_{y2}(x) \end{bmatrix} \times \begin{bmatrix} f_x \\ f_{y1} \\ f_{y2} \end{bmatrix} \quad \text{Equation (2)}$$

Further, combining Equations (1) and (2) gives:

$$\begin{bmatrix} F_x \\ F_y \\ T_z \end{bmatrix} = \begin{bmatrix} r_1 & s_1 & t_1 \\ r_2+r_3 & s_2+s_3 & t_2+t_3 \\ -r_1 \cdot \Delta y - r_2 \cdot L_{y1}(x) + r_3 \cdot L_{y2}(x) & -s_1 \cdot \Delta y - s_2 \cdot L_{y1}(x) + s_3 \cdot L_{y2}(x) & -t_1 \cdot \Delta y - t_2 \cdot L_{y1}(x) + t_3 \cdot L_{y2}(x) \end{bmatrix} \times \begin{bmatrix} F_x^* \\ F_y^* \\ T_z^* \end{bmatrix} \quad \text{Equation (3)}$$

As the decoupling between the set of desired output threes and the set of actual output forces requires the off-diagonal elements in the 3×3 matrix in Equation (3) to be zero, there can be further obtained:

$$\begin{cases} r_1 = 1 \\ r_2 + r_3 = 0 \\ -r_1 \cdot \Delta y - r_2 \cdot L_{y1}(x) + r_3 \cdot L_{y2}(x) = 0 \end{cases} \Rightarrow \begin{cases} r_1 = 1 \\ r_2 = -\dfrac{\Delta y}{L_y} \\ r_3 = \dfrac{\Delta y}{L_y} \end{cases}$$

$$\begin{cases} s_1 = 1 \\ s_2 + s_3 = 1 \\ -s_1 \cdot \Delta y - s_2 \cdot L_{y1}(x) + s_3 \cdot L_{y2}(x) = 0 \end{cases} \Rightarrow \begin{cases} s_1 = 0 \\ s_2 = \dfrac{L_{y2}(x)}{L_y} \\ s_3 = \dfrac{L_{y1}(x)}{L_y} \end{cases}$$

$$\begin{cases} t_1 = 0 \\ t_2 + t_3 = 0 \\ \dfrac{-t_1 \cdot \Delta y - t_2 \cdot L_{y1}(x) + t_3 \cdot L_{y2}(x)}{J_{z0}} = \dfrac{1}{J_z(x)} \end{cases} \Rightarrow \begin{cases} t_1 = 0 \\ t_2 = -\dfrac{J_{z0}}{L_y \cdot J_z(x)} \\ t_3 = \dfrac{J_{z0}}{L_y \cdot J_z(x)} \end{cases}$$

wherein, as $$J_z(x) = J_{z0} + \dfrac{m_x}{m_y}(m_y - m_x) \cdot x^2 + m_y \cdot \Delta x^2 \quad \text{Equation (4)}$$

we obtain:

$$\begin{cases} f_x = F_x^* \\ f_{y1} = -\dfrac{\Delta y}{L_y} F_x^* + \dfrac{L_{y2}(x)}{L_y} F_y^* - \dfrac{J_{z0}}{L_y \cdot J_z(x)} T_z^* \\ f_{y2} = \dfrac{\Delta y}{L_y} F_x^* + \dfrac{L_{y1}(x)}{L_y} F_y^* + \dfrac{J_{z0}}{L_y \cdot J_z(x)} T_z^* \end{cases} \quad \text{Equation (5)}$$

Combining the above equations results in:

$$\begin{cases} r_1 = 1 \\ r_2 = -\dfrac{\Delta y}{L_y} \\ r_3 = \dfrac{\Delta y}{L_y} \end{cases} \quad \text{Equation (6)}$$

$$\begin{cases} s_1 = 0 \\ s_2 = \dfrac{L_{y2}(x)}{L_y} = \dfrac{L_{y2}}{L_y} - \dfrac{\Delta x}{L_y} - \dfrac{m_x}{m_y \cdot L_y} x = -\alpha_1 \cdot x + \beta_{11} \\ s_3 = \dfrac{L_{y1}(x)}{L_y} = \dfrac{L_{y1}}{L_y} + \dfrac{\Delta x}{L_y} + \dfrac{m_x}{m_y \cdot L_y} x = \alpha_1 \cdot x + \beta_{12} \end{cases} \quad \text{Equation (7)}$$

$$\begin{cases} t_1 = 0 \\ t_2 = -\dfrac{J_{z0}}{L_y \cdot J_z(x)} = -\dfrac{J_{z0}}{L_y} \dfrac{1}{J_{z0} + \dfrac{m_x}{m_y}(m_y - m_x) \cdot x^2 + m_y \cdot \Delta x^2} = -\dfrac{1}{\alpha_2 \cdot x^2 + \beta_2} \\ t_3 = \dfrac{J_{z0}}{L_y \cdot J_z(x)} = \dfrac{J_{z0}}{L_y} \dfrac{1}{J_{z0} + \dfrac{m_x}{m_y}(m_y - m_x) \cdot x^2 + m_y \cdot \Delta x^2} = \dfrac{1}{\alpha_2 \cdot x^2 + \beta_2} \end{cases} \quad \text{Equation (8)}$$

Therefore, the expression for converting forces exerted on the logic axes to forces output from the corresponding physical actuators when the control point resides at the centroid is given by:

$$\begin{cases} f_x = F_x^* \\ f_{y1} = -\dfrac{\Delta y}{L_y} F_x^* + (-\alpha_1 \cdot x + \beta_{11}) F_y^* - \dfrac{1}{(-\alpha_2 \cdot x^2 + \beta_2)} T_z^* \\ f_{y2} = \dfrac{\Delta y}{L_y} F_x^* + (\alpha_1 \cdot x + \beta_{12}) F_y^* + \dfrac{1}{(\alpha_2 \cdot x^2 + \beta_2)} T_z^* \end{cases} \quad \text{Equation (9)}$$

where, $$\begin{cases} \alpha_1 = \dfrac{m_x}{m_y \cdot L_y} \\ \beta_{11} = \dfrac{L_{y2}}{L_y} - \dfrac{\Delta x}{L_y} \\ \beta_{12} = \dfrac{L_{y1}}{L_y} + \dfrac{\Delta x}{L_y} \end{cases} \quad \text{Equation (10)}$$

$$\begin{cases} \alpha_2 = \dfrac{L_y}{J_{z0}} \cdot \dfrac{m_x}{m_y}(m_y - m_x) \\ \beta_2 = \dfrac{L_y}{J_{z0}} \cdot (J_{z0} + + m_y \cdot \Delta x^2) \end{cases} \quad \text{Equation (11)}$$

where, $\alpha_1$ represents a rate of change of a distance from a centroid of an X-direction mass $m_x$ to any of the $f_{y1}$ and $f_{y2}$ physical axes caused by a change in an X-direction displacement of a fine stage, $\beta_{11}$ represents an allocation ratio of thrust command when the X-direction mass $m_x$ is at a zero position and a moment at a centroid of a Y-direction mass $m_y$ is balanced in a direction of the $f_{y1}$ physical axis, $\alpha_2$ represents a rate of change of an inertia moment about a $T_z^*$ axis at the centroid of the Y-direction mass $m_y$ caused by the change in the X-direction displacement of the fine stage, $\beta_{12}$ represents an allocation ratio of thrust command when the X-direction mass $m_x$ is at the zero position and a moment at the centroid of the Y-direction mass $m_y$ is balanced in a direction of the $f_{y2}$ physical axis, $\beta_2$ represents a constant scaling factor of the inertia moment about the $T_z^*$ axis at the centroid of the Y-direction mass $m_y$ caused by the change in the X-direction displacement of the fine stage, $r_1$, $r_2$, $r_3$ respectively represent factors of transformation from physical axes $f_x$, $f_{y1}$, $f_{y2}$ to logic axis $F_x^*$, $s_1$, $s_2$, $s_3$ respectively represent factors of transformation from physical axes $f_x$, $f_{y1}$, $f_{y2}$ to logic axis $F_y^*$ and $t_1$, $t_2$, $t_3$ respectively represent factors of transformation from physical axes $f_x$, $f_{y1}$, $f_{y2}$ logic axis $T_z^*$.

Centroid measurement and calibration algorithm:

The measurement and calibration of $\Delta x$:

1) estimating a range for $\Delta x$ in the coordinate system of the coarse stage and setting the value of $\Delta x$ as a lower limit of the range, wherein as the estimated position of the centroid (i.e., a position range of the centroid) can generally be determined during the design and manufacture of the coarse stage, the range is generally a known one, which can be determined by, for example, the mass and a design centroid of the coarse stage, and it is just one of the objectives of the present invention to find the exact position of the centroid of the coarse stage within this design range; and to make sure that the actual centroid of the coarse stage could be found within this range, it is generally recommended to perform the centroid measurement in a range slightly broader than the design range, for example, when the design range with respect to the X direction (an X-direction coordinate range) is [a_min, a_max], the centroid measurement could be carried out in a broadened range of [1.1*a_min, 1.1*a_max], or [1.2*a_min, 1.2*a_max], or any other proper value;

2) retrieving the coarse stage to the zero position of the X-direction grating (i.e., the origin of the coordination system of the coarse stage) and carrying out a closed-loop servo control;

3) closed-loop controlling the coarse stage to keep at the zero position in the Rz direction, performing a closed-loop control in the Y direction, providing the Y direction with a one-pass forth-and-back trajectory, tracking and recording a set of Rz-direction positional deviations;

4) setting a stroke and changing the value of $\Delta x$ by one such stroke, providing the Y direction with the same trajectory as in step 3), and recording a corresponding set of Rz-direction positional deviations, wherein the changed value of $\Delta x$ is within the range prescribed in step 1);

5) successively changing the value of $\Delta x$ and repeating step 4) until the upper limit of the range prescribed in step 1) is reached;

6) fitting the Rz-direction positional deviations obtained in the repeated one-pass forth-and-back motions into two parabolas using a method of least squares, wherein those Rz-direction positional deviations corresponding to motions in the same direction are assumed to be fitted into a second-order parabola, and identifying the actual X-direction eccentricity as the extremum of either of the parabolas.

If the fitting in step 6) fails to result in parabolic curves, the possible reason may be that the actual centroid of the coarse stage is not included in the range for $\Delta x$ determined in step 1). For this case, an effective solution is to redo the above described measurement and calibration process with a narrower new $\Delta x$ range defined by two points on both sides of the obtained quasi-centroid and a smaller stroke for improving resolution in approximating the actual X-direction eccentricity.

The measurement and calibration of $\Delta y$:

1) estimating a range for $\Delta y$ in the coordinate system of the coarse stage and setting the value of $\Delta y$ as a lower limit of the range, wherein the range for $\Delta y$ may be determined in a similar way to that for the $\Delta x$ range, i.e., by design values of the coarse stage and the past experience of a person of ordinary skill in the art;

2) retrieving the coarse stage to the zero position of the Y-direction grating (i.e., the origin of the coordination system of the coarse stage) and carrying out a closed-loop servo control;

3) closed-loop controlling the coarse stage to keep at the zero position in the Rz direction, performing a closed-loop control in the X direction, providing the X direction with a one-pass forth-and-back trajectory, tracking and recording a set of Rz-direction positional deviations of the coarse stage;

4) setting a stroke and changing the value of $\Delta y$ by one such stroke, providing the X direction with the same trajectory as in step 3), and recording a corresponding set of Rz-direction positional deviations, wherein the changed value of $\Delta y$ is within the range prescribed in step 1);

5) successively changing the value of $\Delta y$ and repeating step 4) until the upper limit of the range prescribed in step 1) is reached;

6) fitting the Rz-direction positional deviations obtained in the repeated one-pass forth-and-back motions into two parabolas using a method of least squares, wherein those Rz-direction positional deviations corresponding to motions in the same direction are assumed to be fitted into a second-order parabola, and identifying the actual Y-direction eccentricity as the extremum of either of the parabolas.

Similarly, if the fitting in step 6) fails to result in parabolic curves, the possible reason may be that the actual centroid of the coarse stage is not included in the range for $\Delta y$ determined in step 1). For this case, an effective solution is to redo the above described calibration process with a narrower new $\Delta y$ range defined by two points on both sides of the obtained quasi-centroid and a smaller stroke for improving resolution in approximating the actual Y-direction eccentricity.

In summary; the present invention provides a method for measuring and calibrating a centroid of a coarse stage of a wafer stage and compensating a controller in a real time fashion. The method applies a closed-loop control to each of the three degrees of freedom X, Y and Rz of the coarse stage. The closed-loop control performed in the X direction is realized by using the X-direction grating, and the closed-loop controls performed in the Y and Rz directions are achieved by using the two Y-direction gratings followed by converting the measurements into the coordinate system of the coarse stage, which is centered at the common zero position of the X-direction and Y-direction gratings and also at the midpoint of the coarse stage.

Next, in the coordinate system of the coarse stage, a possible range of the centroid of the coarse stage for each of the X and Y directions is prescribed and equally divided into N parts, wherein the possible range of the centroid may be determined according to, for example, the design mass and design centroid of each component of the coarse stage. Dividing points are thereafter successively substituted, in the order from the lower limit of the corresponding range upwards, into the compensation calculation and the centroid calibration calculation as eccentricities in the corresponding direction. That is, the centroid calibration is synchronized with the parameter optimization of the controller. This can make the measured position closer to the actual position of the centroid of the coarse stage and control of the controller on the coarse stage more accurate, Moreover, during the measurement of X-direction eccentricity, the coarse stage is kept at the zero positions in both the X direction and the Rz direction by the closed-loop control, and the Y direction is provided with a motion trajectory. Similarly, during the measurement of Y-direction eccentricity, the coarse stage is kept at the zero positions in both the Y direction and the Rz direction by the closed-loop control, and the X direction is provided with a motion trajectory. It will be appreciated that a greater N (i.e., a smaller stroke set in the above described step 4)) can result in a higher accuracy in measuring the position of the centroid.

After that, a mean value of each set of the N sets of Rz-direction positional deviations recorded during the motion of the coarse stage is calculated, and a minimum of the mean values is selected as the result of the measurement and compared with a preset Rz-direction positional deviation threshold. If the minimum of the mean values is smaller than the threshold, the eccentricity corresponding to the set of Rz-direction positional deviations providing the minimum is taken as the actual eccentricity and written in the machine as a constant. Otherwise, if the minimum of the mean values is greater than the threshold, the centroid measurement is redone with the range between the eccentricities adjacently in front of and behind the eccentricity corresponding to the set of positional deviations providing the minimum designated as a new range for the centroid, and the measurement is repeated until the minimum of the mean values is smaller than the threshold.

Figure 6:
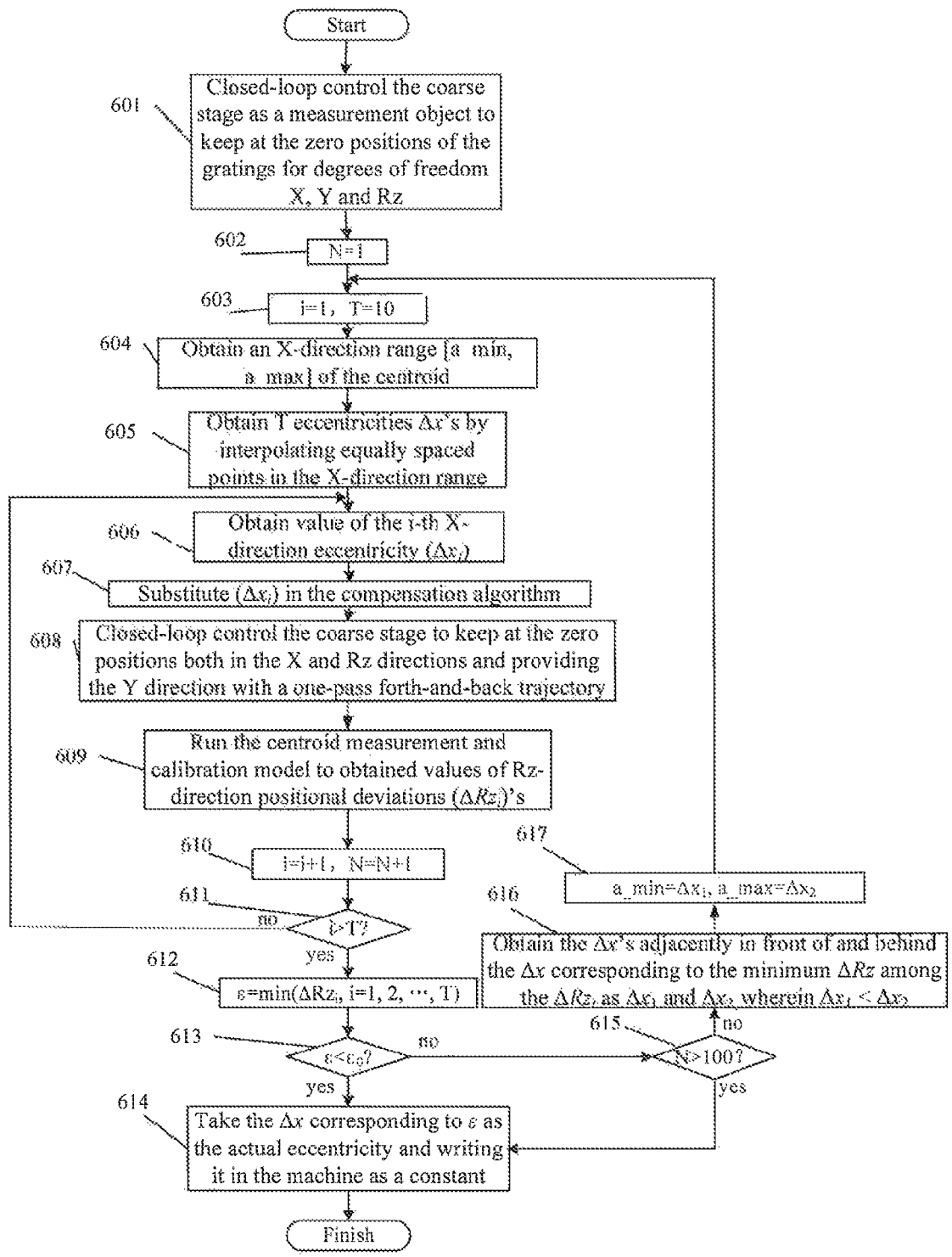
FIG. 6 is a flowchart representing the specific process of a method for measuring and calibrating a centroid of the present invention.

FIG. 6 is a flowchart representing the process of a method for measuring and calibrating a centroid in accordance with an exemplary embodiment of the present invention. Although the following description and the associated figure are given only to the measurement and calibration of the X-direction eccentricity, in light of them, a person with ordinary skill in the art will easily realize how it is implemented in the Y direction, so its description is omitted in this specification. As illustrated in FIG. 6, the measurement and calibration of the X-direction eccentricity include the steps of:

601—closed-loop controlling the coarse stage as a measurement object to keep at the zero positions of the gratings for degrees of freedom X, Y and Rz;

602—setting N=1 to read a first set of data;

603—setting i=1 and T=10, determining, within the coordinate system of the coarse stage, a possible range of the centroid of the coarse stage in the X direction, equally dividing the range into T parts (10 parts in this embodiment), and successively designating dividing points as eccentricities in the order from the lower limit upwards with the first designation occurring at i=1;

604—obtaining an X-direction range [$\alpha\_min$, $\alpha\_max$] of the centroid, the range being a coordinate range;

605—obtaining T eccentricities $\Delta x$'s by interpolating equally spaced points in the X-direction range, i.e., equally dividing the range [$\alpha\_min$, $\alpha\_max$] into T parts to obtain the T eccentricities $\Delta x$'s each corresponding to a dividing point, wherein each $\Delta x$ is defined as an X-direction distance of the associated dividing point to the origin of the coordinate system of the coarse stage and the distance is signed positive or negative;

606—obtaining value of the i-th X-direction eccentricity ($\Delta x_i$) which is a coordinate value;/

607—substituting ($\Delta x_i$) in the compensation algorithm to calculate the values of $\alpha_1$, $\alpha_2$, $\beta_{11}$, $\beta_{12}$ and $\beta_2$ according to Equations (10) and (11) and compensating for the controller with the calculated values to improve the accuracy of the control of the controller on the coarse stage, wherein it is noted that after the compensation, the range [$\alpha\_min$, $\alpha\_max$] obtained in step 604 will be modified accordingly, and the modified range will undergo the same processes in steps 605 and 606 to generate new $\Delta x$'s and ($\Delta x_i$), based on which the centroid will be further calibrated;

608—closed-loop controlling the coarse stage to keep at the zero positions both in the X and Rz directions and providing the Y direction with a one-pass forth-and-back trajectory, wherein steps 606 to 608 correspond to the steps 1) to 5) of the above described X-direction measurement and calibration of the centroid, i.e., estimating a range for $\Delta x$ in the coordinate system of the centroid of the coarse stage and setting the value of $\Delta x$ to the lower limit of the range, namely $\alpha\_min$; retrieving the coarse stage to the zero position of the X-direction grating (i.e., the origin of the coordination system of the coarse stage) and carrying out a closed-loop servo control; closed-loop controlling the coarse stage to keep at the zero position in the Rz direction, performing a closed-loop control in the Y direction, providing the Y direction with a one-pass forth-and-back trajectory, tracking and recording a set of Rz-direction positional deviations; setting a stroke and changing the value of $\Delta x$ by one such stroke within the range prescribed in step 604, providing the Y direction with the same trajectory as in step 608, and recording the corresponding set of Rz-direction positional deviations; and successively changing the value of $\Delta x$ and repeating step 608 until the upper limit $\alpha\_max$ of the range prescribed in step 604 is reached;

609—running the centroid measurement and calibration model to obtained values of Rz-direction positional deviations ($\Delta Rz_i$)'s which are coordinate values;

610—setting i=i+1 to read the (N+1)-th set of data;

611—checking whether all eccentricities corresponding to the dividing points have been measured and calibrated, returning to step 606 if false, and proceeding to step 612 if true;

612—calculating a mean value of each set of the T sets of Rz-direction positional deviations ($\Delta Rz_i$)'s recorded during the motion of the coarse stage, fitting the mean values using a method of least squares, and selecting a minimum $\epsilon$=min ($\Delta Rz_i$, i=1, 2 . . . T) as the result of the measurement;

613—comparing the minimum $\epsilon$ with a preset Rz-direction positional deviation threshold $\epsilon_0$ to check whether $\epsilon \leq \epsilon_0$ is met, completing the measurement and proceeding to step 614 if true, and returning to step 615 if false;

614—taking the $\Delta x$ corresponding to $\epsilon$ as the actual eccentricity and writing it in the machine as a constant, i.e., taking the eccentricity corresponding to the set of Rz-direction positional deviations providing the minimum as the actual eccentricity and writing it in the machine as a constant;

615—checking whether N is greater than 100, completing the measurement and proceeding to step 614 if true, and returning to step 616 if false, Wherein it is noted that this step is to prevent this flow from infinitely looping, and that N is not limited to 100 and can be set to other values according to practical needs;

616—obtaining the $\Delta x$'s adjacently in front of and behind the $\Delta x$ corresponding to the minimum $\Delta Rz$ among the $\Delta Rz_i$ as $\Delta x_1$ and $\Delta x_2$, wherein $\Delta x_1 < \Delta x_2$; and 617—designating the range between the eccentricities adjacently in front of and behind the eccentricity corresponding to the set of positional deviations providing the minimum, i.e., [$\alpha\_min=\Delta x_1$, $\alpha\_max=\Delta x_2$], as a new range for the centroid and, resetting i and T (i.e., returning to step 603) to restart the measurement, and repeating the measurement until the minimum of the Rz-direction positional deviations is smaller than the prescribed threshold.

Figure 4:
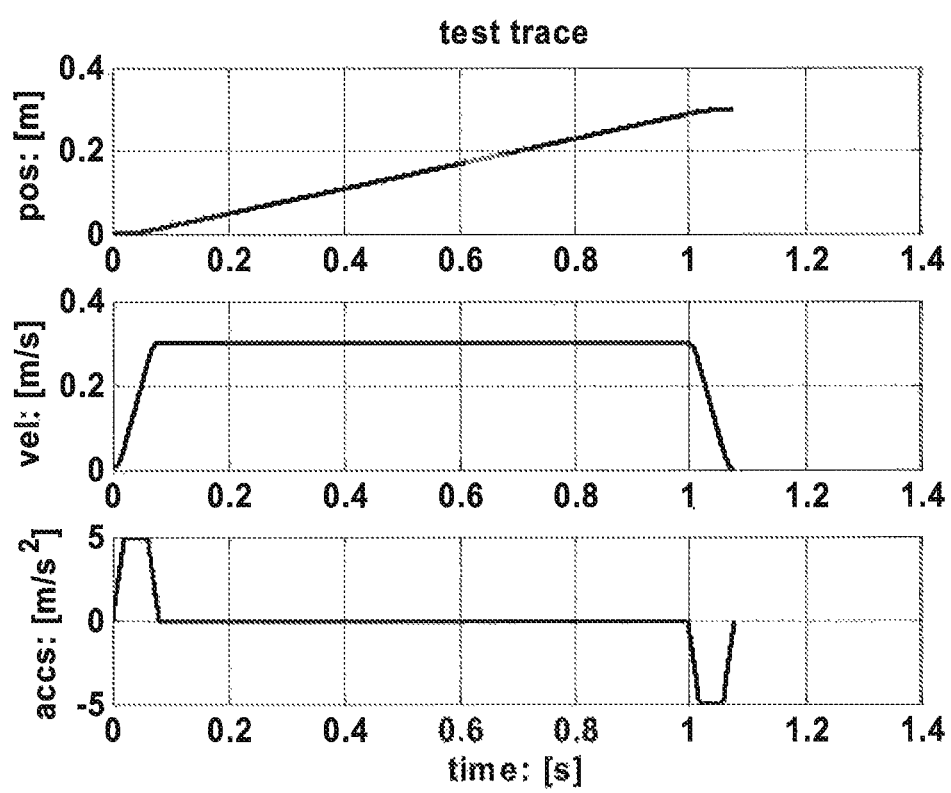
FIG. 4 shows a motion trace of the coarse stage in the centroid measurement and calibration in a simulation test.

FIG. 4 shows a motion trace of the coarse stage in a simulation test according to the centroid measurement and calibration method of the present invention.

Figure 5:
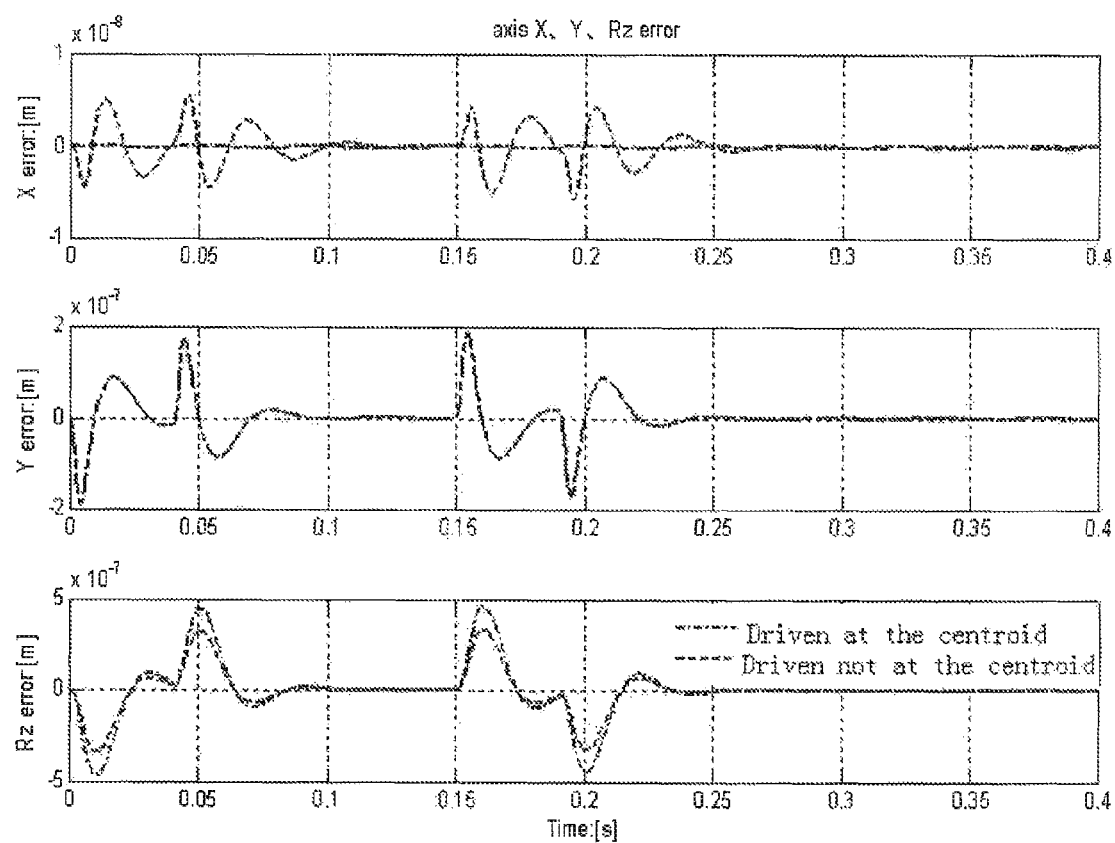
FIG. 5 shows positional deviation profiles of a coarse stage in the three horizontal degrees of freedom in the simulation test.

FIG. 5 shows positional deviation profiles of the coarse stage in the three degrees of freedom in the simulation test performed with the coarse stage provided with a testing motion track in the Y direction. As can be seen from the figure, the coarse stage shows different positional deviation behaviors in the Rz direction when driven at and not at its centroid. Therefore, the magnitude of the Rz-direction positional deviation can function as an indicator for whether the centroid of the coarse stage has been properly calibrated.

The following table demonstrates the input parameters and results of a practical test of the centroid measurement and calibration method o present invention.

| Input parameters | | | |
|---|---|---|---|
| Preset X-direction eccentricity of the coarse stage (mm) | +5.5 | Preset Rz-direction positional deviation threshold (mrad) | 1e−7 |
| Preset Y-direction eccentricity of the coarse stage (mm) | +18.5 | Cycles of measurement | 20 |
| Output parameters | | | |
| Measured calibrated X-direction eccentricity of the balancing mass (mm) | +5.264 | | |
| Measured calibrated Y-direction eccentricity of the balancing mass (mm) | +18.312 | | |

The test results show that: taking the X-direction eccentricity measurement for example, a difference between the set and measured calibrated X-direction eccentricities is as small as 0.236 mm which manifests a high measurement accuracy of the inventive method. In addition, the measurement accuracy can be further improved by increasing the cycles of measurement.

The preferred embodiments disclosed above are merely for describing the present invention and are not intended to limit the invention in any way. All alternative embodiments obtained by those skilled in the art through logical analysis, inference or limited experimentation based on the principles of the present invention are considered to be within the scope of the invention.

What is claimed is:

1. A method for measuring and calibrating a centroid of a coarse stage of a photolithography tool by means of measuring an offset of the centroid relative to a midpoint of the coarse stage, comprising the steps of:

step 1, individually performing closed-loop controls with a controller on parameters of three horizontal degrees of freedom (X, Y, Rz) of the coarse stage and converting the parameters into coordinates in a coordinate system of the coarse stage, wherein X and Y are two directions orthogonal to each other within a horizontal plane, and Rz is rotation about a vertical axis within the horizontal plane;

step 2, determining an initial X-direction range and an initial Y-direction range for the centroid in the coordinate system of the coarse stage and equally dividing each of the initial X-direction range and the initial Y-direction range into N parts, designating dividing points of the initial X-direction range as X-direction eccentricities Δx's, and designating dividing points of the initial Y-direction range as Y-direction eccentricities Δy's, wherein N is a natural number;

step 3, obtaining N Rz-direction positional deviations by conducting a calibration calculation with the controller based on the X-direction eccentricities Δx's, comparing a minimum Rz-direction positional deviation derived from the N Rz-direction positional deviations with a preset Rz-direction positional deviation threshold, if the minimum Rz-direction positional deviation is smaller than the preset Rz-direction positional deviation threshold, designating an X-direction eccentricity Δx corresponding to the minimum Rz-direction positional deviation as an actual X-direction eccentricity and proceeding to step 5, and otherwise designating an updated X-direction range whose limits are selected as X-direction eccentricities adjacently in front of and behind the X-direction eccentricity corresponding to the minimum Rz-direction positional deviation, respectively, equally dividing the updated X-direction range into N parts, designating dividing points of the updated X-direction range as updated X-direction eccentricities Δx's, and repeating step 3;

step 4, obtaining N Rz-direction positional deviations by conducting a calibration calculation with the controller based on the Y-direction eccentricities Δy's, comparing a minimum Rz-direction positional deviation derived from the N Rz-direction positional deviations with a preset Rz-direction positional deviation threshold, if the minimum Rz-direction positional deviation is smaller than the preset Rz-direction positional deviation threshold, designating a Y-direction eccentricity Δy corresponding to the minimum Rz-direction positional deviation as an actual Y-direction eccentricity and proceeding to step 5, and otherwise designating an updated Y-direction range whose limits are selected as Y-direction eccentricities adjacently in front of and behind the Y-direction eccentricity corresponding to the minimum Rz-direction positional deviation, respectively, equally dividing the updated Y-direction range into N parts, designating dividing points of the updated Y-direction range as updated Y-direction eccentricities Δy's, and repeating step 4; and step 5, deriving the offset of the centroid according to results of steps 3 and 4, wherein, step 3 is carried out prior to, subsequent to, or concurrently with step 4.

2. The method of claim 1, further comprising: conducting a compensation calculation, based on the actual X-direction and Y-direction eccentricities and a midpoint coordinate of the coarse stage fed back in real time to the controller, to adjust the parameters of three horizontal degrees of freedom (X, Y, Rz) of the coarse stage.

3. The method of claim 2, wherein the closed-loop control on the coarse stage in the X direction is performed by using an X-direction grating and the closed-loop controls on the coarse stage in the Y and Rz directions are performed by using two Y-direction gratings.

4. The method of claim 3, wherein the coordinate system of the coarse stage is centered at a common zero position of the X-direction and Y-direction gratings and also at the midpoint of the coarse stage.

5. The method of claim 3, wherein the coarse stage is driven by using an X-direction actuator, a first Y-direction actuator and a second Y-direction actuator, and wherein the compensation calculation includes: collecting readings of the respective gratings and obtaining midpoint coordinates of the coarse stage with respect to X, Y and Rz axes, respectively; receiving desired control forces from the controller for X, Y and Rz logic axes; and allocating output forces to physical axes of the respective actuators according to a compensation algorithm.

6. The method of claim 5, wherein the compensation algorithm includes the following equation:

$$\begin{cases} f_x = F_x^* \\ f_{y1} = -\dfrac{\Delta y}{L_y} F_x^* + \dfrac{L_{y2}(x)}{L_y} F_y^* - \dfrac{J_{z0}}{L_y \cdot J_z(x)} T_z^* \\ f_{y2} = \dfrac{\Delta y}{L_y} F_x^* + \dfrac{L_{y1}(x)}{L_y} F_y^* + \dfrac{J_{z0}}{L_y \cdot J_z(x)} T_z^* \end{cases}$$

where, Δx represents an X-direction eccentricity of the coarse stage, Δy represents a Y-direction eccentricity of the coarse stage, $J_{z0}$ represents a rotational inertia of the coarse stage about the vertical axis of the centroid, x represents the reading of the X-direction grating, $F_x^*$, $F_y^*$ and $T_z^*$ respectively represent the desired control forces for the X, Y and Rz logic axes, $f_x$, $f_{y1}$ and $f_{y2}$ respectively represent desired output forces for the physical axes of the respective actuators $L_{y1}(x)$ represents a distance from a force output point of the first Y-direction actuator to an X-direction centroid of the coarse stage, $L_{y2}(x)$ represents a distance from a force output point of the second Y-direction actuator to the X-direction centroid of the coarse stage, $L_y$ represents an interval between the first and second Y-direction actuators with respect to the X direction and, $$J_z(x) = J_{z0} + \frac{m_x}{m_y}(m_y - m_x) \cdot x^2 + m_y \cdot \Delta x^2,$$

wherein $m_x$ represents an X-direction mass and $m_y$ represents a Y-direction mass.

7. The method of claim 6, wherein the compensation algorithm further includes the following equations:

$$\begin{cases} r_1 = 1 \\ r_2 = -\frac{\Delta y}{L_y} \\ r_3 = \frac{\Delta y}{L_y} \end{cases}, \begin{cases} s_1 = 0 \\ s_2 = \frac{L_{y2}(x)}{L_y} = \frac{L_{y2}}{L_y} - \frac{\Delta x}{L_y} - \frac{m_x}{m_y \cdot L_y}x = -\alpha_1 \cdot x + \beta_{11} \\ s_3 = \frac{L_{y1}(x)}{L_y} = \frac{L_{y1}}{L_y} + \frac{\Delta x}{L_y} + \frac{m_x}{m_y \cdot L_y}x = \alpha_1 \cdot x + \beta_{12} \end{cases}, \text{and}$$

$$\begin{cases} t_1 = 0 \\ t_2 = -\frac{J_{z0}}{L_y \cdot J_z(x)} = -\frac{J_{z0}}{L_y} \frac{1}{J_{z0} + \frac{m_x}{m_y}(m_y - m_x) \cdot x^2 + m_y \cdot \Delta x^2} = \\ \qquad \frac{1}{\alpha_2 \cdot x^2 + \beta_2} \\ t_3 = \frac{J_{z0}}{L_y \cdot J_z(x)} = \frac{J_{z0}}{L_y} \frac{1}{J_{z0} + \frac{m_x}{m_y}(m_y - m_x) \cdot x^2 + m_y \cdot \Delta x^2} = \frac{1}{\alpha_2 \cdot x^2 + \beta_2} \end{cases}$$

where, $\Delta_1$ represents a rate of change of a distance from a centroid of the X-direction mass $m_x$ to any of the $f_{y1}$ and $f_{y2}$ physical axes caused by a change in an X-direction displacement of a fine stage, $\beta_{11}$ represents an allocation ratio of thrust command when the X-direction mass $m_x$ is at a zero position and a moment at a centroid of the Y-direction mass $m_y$ is balanced in a direction of the $f_{y1}$ physical axis, $\Delta_2$ represents a rate of change of an inertia moment about a $T_z*$ axis at the centroid of the Y-direction mass $m_y$ caused by the change in the X-direction displacement of the fine stage, $\beta_{12}$ represents an allocation ratio of thrust command when the X-direction mass $m_x$ is at the zero position and a moment at the centroid of the Y-direction mass $m_y$ is balanced in a direction of the $f_{y2}$ physical axis, $\beta_2$ represents a constant scaling factor of the inertia moment about the $T_z*$ axis at the centroid of the Y-direction mass $m_y$ caused by the change in the X-direction displacement of the fine stage, $r_1$, $r_2$, $r_3$ respectively represent factors of transformation from physical axes $f_x$, $f_{y1}$, $f_{y2}$ to logic axis $F_y*$, $s_1$, $s_2$, $s_3$ respectively represent factors of transformation from physical axes $f_x$, $f_{y1}$, $f_{y2}$ to logic axis $F_y*$, and $t_1$, $t_2$, $t_3$ respectively represent factors of transformation from physical axes $f_x$, $f_{y1}$, $f_{y2}$ to logic axis $T_z*$.

8. The method of claim 3, wherein in step 3, during the calibration calculation based on the X-direction eccentricities $\Delta x$'s, the coarse stage is kept at a zero position in both the X direction and the Rz direction by the closed-loop control, and the Y direction is provided with a motion trajectory.

9. The method of claim 8, wherein the calibration calculation in step 3 includes the steps of:
S101, setting a value of $\Delta x$ as a lower limit of the X-direction range;
S102, retrieving the coarse stage to a zero position of the X-direction grating and carrying out a closed-loop servo control;
S103, closed-loop controlling the coarse stage to keep at a zero position in the Rz direction, performing a closed-loop control in the Y direction and providing the Y direction with a one-pass forth-and-back trajectory, tracking and recording an Rz-direction positional deviation;
S104, treating each of the N equal parts of the X-direction range as a stroke and changing the value of $\Delta x$ by one stroke, providing the Y direction with the same one-pass forth-and-back trajectory as in step S103, and recording a corresponding Rz-direction positional deviation;
S105, successively changing the value of $\Delta x$ by one stroke and repeating step S104 until the upper limit of the X-direction range is reached; and
S106, fitting the Rz-direction positional deviations using a method of least squares to obtain a minimum Rz-direction positional deviation.

10. The method of claim 3, wherein in step 4, during the calibration calculation based on the Y-direction eccentricities $\Delta y$, the coarse stage is kept at a zero position in both the Y direction and the Rz direction by the closed-loop control, and the X direction is provided with a motion trajectory.

11. The method of claim 10, wherein the calibration calculation in step 4 includes the steps of:
S201, setting a value of $\Delta y$ as a lower limit of the Y-direction range;
S202, retrieving the coarse stage to a zero position of the Y-direction grating and carrying out a closed-loop servo control;
S203, closed-loop controlling the coarse stage to keep at a zero position in the Rz direction, performing a closed-loop control in the X direction and providing the X direction with a one-pass forth-and-back trajectory, tracking and recording an Rz-direction positional deviation;
S204, treating each of the N equal parts of the Y-direction range as a stroke and changing the value of $\Delta y$ by one stroke, providing the X direction with the same one-pass forth-and-back trajectory as in step S203, and recording a corresponding Rz-direction positional deviation;
S205, successively changing the value of $\Delta y$ by one stroke and repeating step S204 until the upper limit of the Y-direction range is reached; and
S206, fitting the Rz-direction positional deviations using a method of least squares to obtain a minimum Rz-direction positional deviation.

12. The method of claim 1, wherein the closed-loop control on the coarse stage in the X direction is performed by using an X-direction grating and the closed-loop controls on the coarse stage in the Y and Rz directions are performed by using two Y-direction gratings.

13. The method of claim 12, wherein the coordinate system of the coarse stage is centered at a common zero position of the X-direction and Y-direction gratings and also at the midpoint of the coarse stage.

14. The method of claim 12, wherein the coarse stage is driven by using an X-direction actuator, a first Y-direction actuator and a second Y-direction actuator, and wherein the compensation calculation includes: collecting readings of the respective gratings and obtaining midpoint coordinates of the coarse stage with respect to X, Y and Rz axes, respectively; receiving desired control forces from the controller for X, Y and Rz logic axes; and allocating output forces to physical axes of the respective actuators according to a compensation algorithm.

15. The method of claim 14, wherein the compensation algorithm includes the following equation:

$$\begin{cases} f_x = F_x^* \\ f_{y1} = -\frac{\Delta y}{L_y} F_x^* + \frac{L_{y2}(x)}{L_y} F_y^* - \frac{J_{z0}}{L_y \cdot J_z(x)} T_z^* \\ f_{y2} = \frac{\Delta y}{L_y} F_x^* + \frac{L_{y1}(x)}{L_y} F_y^* + \frac{J_{z0}}{L_y \cdot J_z(x)} T_z^* \end{cases}$$

where, $\Delta x$ represents an X-direction eccentricity of the coarse stage, $\Delta y$ represents a Y-direction eccentricity of the coarse stage, $J_{z0}$ represents a rotational inertia of the coarse stage about the vertical axis of the centroid, x represents the reading of the X-direction grating, $F_x^*$, $F_y^*$, and $T_z^*$ respectively represent the desired control forces for the X, Y and Rz logic axes, $f_x$, $f_{y1}$ and $f_{y2}$ respectively represent desired output forces for the physical axes of the respective actuators $L_{y1}(x)$ represents a distance from a force output point of the first Y-direction actuator to an X-direction centroid of the coarse stage, $L_{y2}(x)$ represents a distance from a force output point of the second Y-direction actuator to the X-direction centroid of the coarse stage, $L_y$ represents an interval between the first and second Y-direction actuators with respect to the X direction and $J_z(x)=J_{z0}+m_x/m_y(m_y-m_x)\cdot x^2+m_y\cdot\Delta x^2$, wherein $m_x$ represents an X-direction mass and $m_y$ represents a Y-direction mass.

16. The method of claim 15, wherein the compensation algorithm further includes the following equations:

$$\begin{cases} r_1 = 1 \\ r_2 = -\frac{\Delta y}{L_y} \\ r_3 = \frac{\Delta y}{L_y} \end{cases}, \begin{cases} s_1 = 0 \\ s_2 = \frac{L_{y2}(x)}{L_y} = \frac{L_{y2}}{L_y} - \frac{\Delta x}{L_y} - \frac{m_x}{m_y \cdot L_y} x = -\alpha_1 \cdot x + \beta_{11} \\ s_3 = \frac{L_{y1}(x)}{L_y} = \frac{L_{y1}}{L_y} + \frac{\Delta x}{L_y} + \frac{m_x}{m_y \cdot L_y} x = \alpha_1 \cdot x + \beta_{12} \end{cases}, \text{ and}$$

$$\begin{cases} t_1 = 0 \\ t_2 = -\frac{J_{z0}}{L_y \cdot J_z(x)} = -\frac{J_{z0}}{L_y} \frac{1}{J_{z0} + \frac{m_x}{m_y}(m_y - m_x) \cdot x^2 + m_y \cdot \Delta x^2} = \frac{1}{\alpha_2 \cdot x^2 + \beta_2} \\ t_3 = \frac{J_{z0}}{L_y \cdot J_z(x)} = \frac{J_{z0}}{L_y} \frac{1}{J_{z0} + \frac{m_x}{m_y}(m_y - m_x) \cdot x^2 + m_y \cdot \Delta x^2} = \frac{1}{\alpha_2 \cdot x^2 + \beta_2} \end{cases}$$

where, $\alpha_1$ represents a rate of change of a distance from a centroid of the X-direction mass $m_x$ to any of the $f_{y1}$ and $f_{y2}$ physical axes caused by a change in an X-direction displacement of a fine stage, $\beta_{11}$ represents an allocation ratio of thrust command when the X-direction mass $m_x$ is at a zero position and a moment at a centroid of the Y-direction mass $m_y$ is balanced in a direction of the $f_{y1}$ physical axis, $\alpha_2$ represents a rate of change of an inertia moment about a $T_z^*$ axis at the centroid of the Y-direction mass $m_y$ caused by the change in the X-direction displacement of the fine stage, $\beta_{12}$ represents an allocation ratio of thrust command when the X-direction mass $m_x$ is at the zero position and a moment at the centroid of the Y-direction mass $m_y$ is balanced in a direction of the $f_{y2}$ physical axis, $\beta_2$ represents a constant scaling factor of the inertia moment about the $T_z^*$ axis at the centroid of the Y-direction mass $m_y$ caused by the change in the X-direction displacement of the fine stage, $r_1$, $r_2$, $r_3$ respectively represent factors of transformation from physical axes $f_x$, $f_{y1}$, $f_{y2}$ to logic axis $F_x^*$, $s_1$, $s_2$, $s_3$ respectively represent factors of transformation from physical axes $f_x$, $f_{y1}$, $f_{y2}$ to logic axis $F_y^*$, and $t_1$, $t_2$, $t_3$ respectively represent factors of transformation from physical axes $f_x$, $f_{y1}$, $f_{y2}$ to logic axis $T_z^*$.

17. The method of claim 12, wherein in step 3, during the calibration calculation based on the X-direction eccentricities $\Delta x$'s, the coarse stage is kept at a zero position in both the X direction and the Rz direction by the closed-loop control, and the Y direction is provided with a motion trajectory.

18. The method of claim 17, wherein the calibration calculation in step 3 includes the steps of:
S101, setting a value of $\Delta x$ as a lower limit of the X-direction range;
S102, retrieving the coarse stage to a zero position of the X-direction grating and carrying out a closed-loop servo control;
S103, closed-loop controlling the coarse stage to keep at a zero position in the Rz direction, performing a closed-loop control in the Y direction and providing the Y direction with a one-pass forth-and-back trajectory, tracking and recording an Rz-direction positional deviation;
S104, treating each of the N equal parts of the X-direction range as a stroke and changing the value of $\Delta x$ by one stroke, providing the Y direction with the same one-pass forth-and-back trajectory as in step S103, and recording a corresponding Rz-direction positional deviation;
S105, successively changing the value of $\Delta x$ by one stroke and repeating step S104 until the upper limit of the X-direction range is reached; and
S106, fitting the Rz-direction positional deviations using a method of least squares to obtain a minimum Rz-direction positional deviation.

19. The method of claim 12, wherein in step 4, during the calibration calculation based on the Y-direction eccentricities $\Delta y$, the coarse stage is kept at a zero position in both the Y direction and the Rz direction by the closed-loop control, and the X direction is provided with a motion trajectory.

20. The method of claim 19, wherein the calibration calculation in step 4 includes the steps of:
S201, setting a value of $\Delta y$ as a lower limit of the Y-direction range;
S202, retrieving the coarse stage to a zero position of the Y-direction grating and carrying out a closed-loop servo control;

S203, closed-loop controlling the coarse stage to keep at a zero position in the Rz direction, performing a closed-loop control in the X direction and providing the X direction with a one-pass forth-and-back trajectory, tracking and recording an Rz-direction positional deviation;

S204, treating each of the N equal parts of the Y-direction range as a stroke and changing the value of $\Delta y$ by one stroke, providing the X direction with the same one-pass forth-and-back trajectory as in step S203, and recording a corresponding Rz-direction positional deviation;

S205, successively changing the value of $\Delta y$ by one stroke and repeating step S204 until the upper limit of the Y-direction range is reached; and S206, fitting the Rz-direction positional deviations using a method of least squares to obtain a minimum Rz-direction positional deviation.

21. The method of claim 1, wherein the initial X-direction and Y-direction ranges for the centroid in the coordinate system of the coarse stage are determined according to a mass and a design centroid of the coarse stage.

* * * * *